United States Patent
Hellberg

(10) Patent No.: US 6,324,559 B1
(45) Date of Patent: Nov. 27, 2001

(54) ODD-TRANSFORM FAST CONVOLUTION

(75) Inventor: Lars Richard Birger Hellberg, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/173,803

(22) Filed: Oct. 16, 1998

(51) Int. Cl.[7] .................................................. G06F 17/10
(52) U.S. Cl. ............................................ 708/321; 708/315
(58) Field of Search .................................. 708/315, 321, 708/313

(56) References Cited

U.S. PATENT DOCUMENTS

| 5,270,953 | * | 12/1993 | White | 708/321 |
| 5,768,165 | * | 6/1998 | Palicot et al. | 708/315 |
| 6,134,571 | * | 10/2000 | Kresch et al. | 708/321 |

FOREIGN PATENT DOCUMENTS

| 9802059-7 | 6/1998 | (SE) . |
| WO95/28045 | 10/1995 | (WO) . |

OTHER PUBLICATIONS

"A Flexible On–Board Demultiplexer/Demodulator", S. Joseph Campanella et al., Proceedings of the 12th AIAA International Communication Satellite Systems Conference, 1988, pp. 299–303.

"Frequency–Domain Implementations of Periodically Time– Varying Filters", Earl R. Ferrara, Jr., IEEE Transactions on Acoustics, Speech and Signal Processing, vol. 33, No. 4, Aug. 1985, pp. 883–892.

"Vectorized Mixed Radix Discrete Fourier Transform Algorithms", Ramesh C. Agarwal et al., Proceedings of the IEEE, vol. 75, No. 9, Sep. 1987, pp. 1283–1292.

* cited by examiner

*Primary Examiner*—David H. Malzahn
(74) *Attorney, Agent, or Firm*—Burns, Doane, Swecker & Mathis, L.L.P.

(57) ABSTRACT

The present invention relates generally to the problem of filtering, decimation or interpolation and frequency conversion in the digital domain, and more particularly to the use of the stand-alone or improved modified fast convolution algorithm in wideband multichannel receiver, channelization, and transmitter, de-channelization, structures of a radio communication system. The invention consists of essentially 3 steps: making sure that we use different overlaps on consecutive blocks that, on average, give the same overlap on both the input and output ends; aligning the signal in consecutive blocks of time; and compensating for phase shifts due to frequency shifting. The essence of the invention is that it decouples the input and output transform lengths in the fast convolution algorithm from each other and from the overlap, making it possible to use any transform length on the input together with any transform length on the output and at the same time use any overlap. This provides an enormous amount of freedom compared with the limitations of state of the art.

8 Claims, 9 Drawing Sheets

| INPUT | OUTPUT | CF | NOT CF |
|-------|--------|----|--------|
| $2^x$ | $2^x$ | PRIOR ART | NEW |
| $2^x$ | $Y*2^x$ | NEW | |
| $n_1$ | $n_2$ | ↓ | ↓ |

Fig. 8
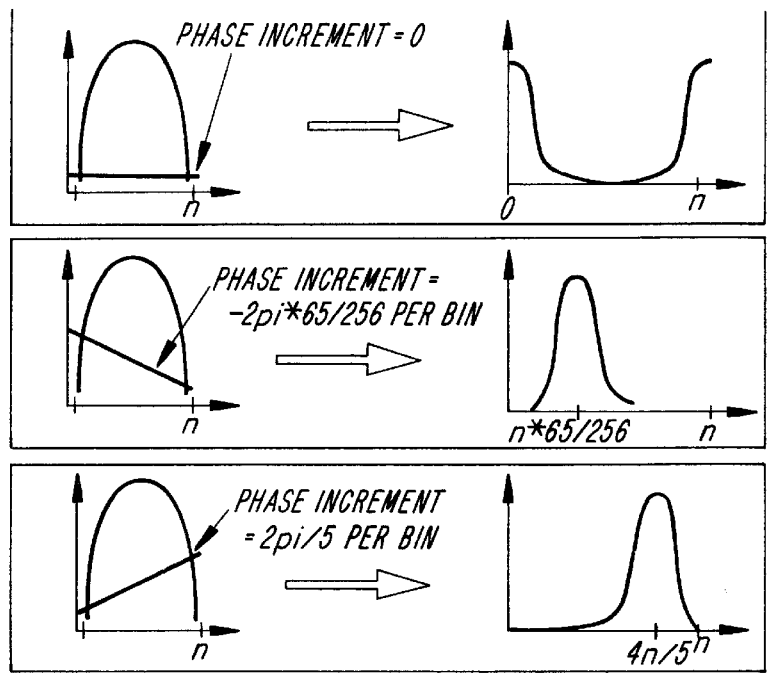
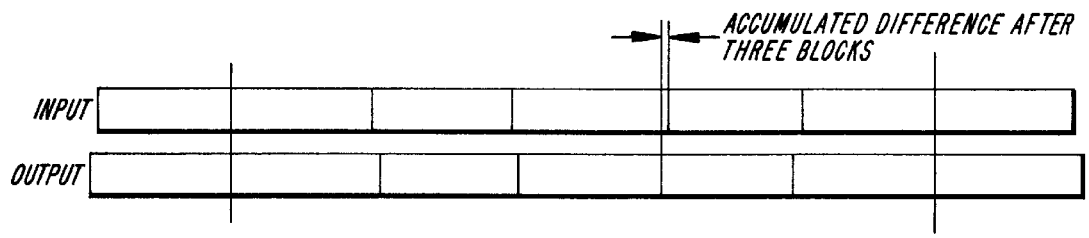
Fig. 9

ODD-TRANSFORM FAST CONVOLUTION

FIELD OF THE INVENTION

The present invention relates generally to the problem of filtering, decimation or interpolation and frequency conversion in the digital domain, and more particularly to the use of a modified fast convolution algorithm in wideband multichannel receiver, channelization, and transmitter, de-channelization, structures of a radio communication system.

RELATED ART

In radio base station applications for cellular, Land Mobile Radio (LMR), satellite, wireless local area networks (WLAN's) and other communication systems, many receiving and transmitting channels are handled simultaneously. In the future this will also become the situation for the terminals, i.e. mobile telephones. There exist channelization and de-channelization structures in the receiver and transmitter, respectively, in these radio systems. Channelization and de-channelization can be defined as the filtering, decimation/interpolation and the frequency conversion of the signals transmitted and received.

The traditional receiver architecture as seen in FIG. 1 can be explained in terms of the Radio Frequency (RF) signal being received by the antenna 105 and then downconverted to an intermediate frequency (IF) by an RF front end 110. The RF front end 110 consists of components such as Low Noise Amplifiers (LNA's), filters and frequency conversion circuits. The desired channel is then extracted by the receiver channelizer 120. The channelizer 120 also consists of LNA's, frequency conversion circuits and filters.

The desired channel is then processed at baseband by the RX baseband processing unit 130 to produce the received digital data stream. Today baseband processing usually consists of analog-to-digital conversion, digital filtering, decimation, equalization, demodulation, channel decoding, de-interleaving, data decoding, timing extraction etc.

The traditional transmitter architecture in FIG. 1, is the dual of the receiver architecture. The transmitted data is first processed by the TX baseband processing unit 140 which consists of data coding, interleaving, channel coding, modulation, interpolation filtering, digital-to-analog conversion etc. The baseband channel is then converted to an IF frequency via the transmit de-channelizer 150. The transmit de-channelizer 150 consists of filters, frequency conversion circuits and low power amplifiers. The IF signal is then converted to RF and amplified by the RF front end 160 which consists of frequency conversion circuits, filters, and a high power amplifier. The signal is then transmitted by the antenna 165.

FIG. 1 illustrates the traditional architecture for a single channel receiver and transmitter as used in a mobile terminal (i.e. mobile phone) application. In the case of a basestation, multiple channels are processed in a similar way. On the receiver end the path will split at some point to form multiple paths for each channel being processed. On the transmitter end the channels will be processed individually and then they will be combined at some point to form a multichannel signal. The point of the split and combination varies, and therefore a variety of basestation receiver and transmitter architectures can be created. More importantly, though, the traditional analog and digital interface is currently somewhere between the channelizer and baseband processing blocks.

The analog channelizer/dechannelizer is complex to design and manufacture, and therefore costly. Therefore, in order to provide a cheaper and more easily produced channelizer/de-channelizer, the future analog and digital interface will lie, instead, somewhere between the RF front end and channelizer blocks. Future radio receiver and transmitter structures of this type are called a variety of names, including multistandard radio, wideband digital tuners, or wideband radio and software defined radio, and they all require a digital channelizer/de-channelizer.

Efficient digital channelizer/de-channelizer structures, consisting of filtering, decimation/interpolation and frequency conversion, are very important in terms of power consumption and die area on a per channel basis. With one of the main goals being to integrate as many channels into a single Integrated Circuit (IC) as possible there are several known ways to achieve digital channelization/de-channelization. In the following examples it is assumed that a wideband signal is sampled by an ADC. The wideband signal is centered at an Intermediate Frequency (IF) and typically consists of many Frequency Division Multiplexed (FDM) channels.

The most obvious way is shown in FIG. 2. This receiver architecture mimics the functions of a traditional analog channelizer with In-phase and Quadrature(IQ) frequency conversion using e.g. sin/cos generators, decimating and filtering on a per-channel basis. The bulk of the decimation filtering can be done with computationally cheap CIC filters. Integrated circuits containing this architecture are readily available from several manufacturers. The dual of this architecture is also possible for the transmitter.

The IQ channelizer is flexible in that it can handle many standards simultaneously and that the channels can be placed arbitrarily. Its main drawback is the need for an IQ frequency conversion at a high input sampling frequency and subsequent decimation filters for each channel. This means that the die area and power consumption is relatively high per channel.

Another channelizer possibility is to build a decimated filter bank in the receiver, as shown in FIG. 3. This method shares a common polyphase filter between many, or all, channels. The hardware cost for this structure is small since it is split between many channels, and good filtering can be achieved. Filter banks are also good for use in transmitter de-channelizers since they both interpolate and add the channels together. An example of this is illustrated in WO 9528045 "Wideband FFT Channelizer".

Many satellite transponders are also built upon this principle. Although these filter banks can be reconfigured to fit different standards, it is still difficult to accommodate multiple channel spacings at the same time. The decimated filter bank has a very low cost per channel, but only if all of the majority of channels are used. This architecture is also very inflexible since the channels have to lie on a fixed frequency grid and only one channel spacing is possible. Multiple standards make the filter bank concept require multiple sampling rates, which means multiple architectures, including the ADC and channelizer, are required for simultaneous multiple standards.

A variation on the structure of the decimated filter bank, called a subsampled filter bank, can lower the computational cost at the expense of flexibility. For example, requirements for adaptive channel allocation, irregular channel arrangement and frequency hopping precludes using subsampled filter banks, since all channels must be available at the same time.

The third main channelization technique is based on the fast convolution scheme of the overlap-add (OLA) or overlap-save (OLS) type. Fast convolution is a means of using cyclic convolution to exactly perform linear convolution, i.e. Finite Impulse Response (FIR) filtering. A state of the art fast convolution algorithm is shown conceptually in FIG. 4. The input data is divided into overlapping blocks in the Block Generator. These blocks are discrete Fourier-transformed in the DFT (Discrete Fourier Transform) and subsequently multiplied point-by-point with a filter response in the frequency domain. This filter response can be obtained by discrete Fourier-transforming the impulse response of a filter. The blocks are then transformed back to the discrete time domain by the Inverse DFT (IDFT) and added together in the Block Combiner. The advantage of this technique is the lower computational requirement as compared to implementing the traditional form of linear convolution.

However, it is possible to modify the basic fast convolution algorithm such that it is possible to simultaneously decimate/interpolate and frequency convert, at the expense of then only approximately performing linear convolution. If the standard fast convolution algorithm is modified so that it includes frequency shifting and decimation/interpolation it can be used for channelization and dechannelization. Generally, one of the transforms is much smaller than the other when this type of modified fast convolution algorithm ("MFC") is used. This reflects that the channels are narrowband compared to the digitized spectrum. FIG. 5 shows conceptually how a modified fast convolution algorithm of the overlap-save type works in the function of a channelizer. The modifications also reduce the computational complexity.

The stand-alone modified fast convolution algorithm, as illustrated in "A Flexible On-board Demultiplexer/Demodulator", Proceedings of the 12th AIAA International Communication Satellite Systems Conference, 1988, pp. 299–303, is claimed to be a very computationally efficient technique for systems containing a mixture of carrier bandwidths, although the technique discussed here is limited to satellite systems.

The stand-alone modified fast convolution algorithm in the prior art performs all the filtering alone, without any additional signal processing. This method leads to various delays. However, delays are an inherent part of satellite systems, due to the time to transmit to and from the satellite. Thus, delays due to the filtering method effects the system proportionately less than if the stand-alone modified fast convolution algorithm were to be used in a radio, e.g. cellular, system. In most radio systems the delay becomes a much more crucial factor which should be reduced as much as possible.

The stand-alone modified fast convolution algorithm, applied to the receiver channelizer, chops the incoming data signal into blocks whose size depends on the percentage of overlap (%overlap) and the length of the Discrete Fourier Transform (DFT). The DFT is subsequently performed. The truncated filter response, that is the number of filter coefficients ($N_{coefficients}$) is less than the length of the DFT ($N_{DFT}$), is implemented directly in the frequency domain. This is accomplished by multiplying the filter coefficients with the selected output bins of the DFT. The result is then processed by an Inverse Discrete Fourier transform (IDFT) of equal length to the truncated filter as a means to recover the time domain samples of the desired channel. The blocks are then overlapped, depending on the %overlap, and combined. The combination is either a process of adding the overlapped section, overlap and add, or discarding the overlapped section, overlap and save. Note that overlap/add and overlap/save can be considered two extremes, and there are techniques known in the art that lie in-between these two.

The truncation of the frequency response in the stand-alone modified fast convolution algorithm distinguishes it from the standard fast convolution approach. It causes the circular convolution algorithm to now only approximate linear convolution, although with carefully chosen coefficients the error can be kept small. Truncation of the frequency response also performs decimation by a factor of ($N_{coefficients}/N_{DFT}$), and the frequency conversion is completed by centering the truncated filter coefficients on the wanted channel.

The truncated frequency response also causes a dramatic reduction in the computational complexity in the channel specific parts of the algorithm, that is everything but the DFT. The number of multiplications needed to implement the frequency filter and the size of the IDFT are reduced by approximately a factor of ($N_{coefficients}/N_{DFT}$). The stand-alone modified fast convolution algorithm can also be applied to the transmitter de-channelizer, containing all the same attributes.

Other reductions in complexity that can be applied to standard fast convolution, can also be applied here to the stand-alone modified fast convolution algorithm. For example the DFT is a critical block in the operation. For efficiency reasons it is usually implemented in the form of a Fast Fourier Transform (FFT). Additionally, two real data blocks can be processed at the same time in one complex DFT processor. Some extra adders and memory are then needed for post-processing. This is more efficient than using two dedicated real DFTs.

Computational savings can also be made in the DFTs through the use of pruning, since only a part of the DFT outputs need to be calculated. Pruning refers to the process of cutting away branches in the DFT that do not affect the output. The output points that are not needed are never computed.

A computational reduction can also be achieved if the complex multiplication of the filter frequency response is replaced by real multiplication and a subsequent circular shift of the IDFT output block of data before it is combined to form the time domain samples of the desired channel. The amount of circular shift depends only on the %overlap and the length of the IDFT.

There is still a problem with the above-identified systems, especially in future systems involving the reception and transmission of many channels simultaneously. As seen above, the choice of a digital channelizer, employed from a few channels up to a large number of channels, is very dependent upon the target radio communication system or systems. Invariably a trade-off between computational cost and flexibility based on the radio systems requirements will make the ultimate decision of which wideband channelizer algorithm to choose. There is still room to improve these channelizer/dechannelizer structures in terms of computational cost and flexibility so that they may be better suited for use in systems with many channels.

A solution to the above-described problems was introduced in the Swedish patent application SE9802059-7 "Digital Channeliser and De-Channeliser", R. Hellberg, the entirety of which is incorporated by reference herein. In that patent application an improved modified fast convolution algorithm is described which efficiently handles the problems associated with conventional channelizers/dechannelizers (i.e., the problems with computational cost, flexibility and acceptable delay with respect to designing those systems to handle multiple channels simultaneously).

The improved modified fast convolution algorithm as described in SE9802059-7 improves upon the stand-alone modified fast convolution when applied to radio communication systems, see FIG. 2. (it splits the necessary filtering between the MFC algorithm and additional channel filtering, thereby improving the power consumption, die area and computational complexity when compare to the prior art stand-alone MFC. It is also a very flexible algorithm in terms of designing it for combination of different systems parameters, sampling frequency, channel bandwidth, channel separation and bit-rate. A further advantage in SE9802059-7 is that the MFC part of the algorithm processes smaller-sized blocks and therefore produces smaller delays, delays which become acceptable for land-based radio communication systems. The improved MFC algorithm is considered to be very suitable for e.g. channelization/de-channelization in a wide variety of radio communication systems. It is therefore a good choice for future hardware platforms that will support multiple standards for more than a few channels activated at one time.

The present invention in this application is applicable to both the stand-alone MFC as found in "A Flexible On-Board Demultiplexer/Demodulator", discussed above, and the improved MFC as found in SE9802059-7. When we use "modified fast convolution" ("MFC") in the remainder of the application we use it to mean either a stand-alone MFC or the improved MFC disclosed in SE9802059-7.

In the modified fast convolution algorithm as used in state of the art channelizers, the number of points in the DFT and IDFT (computed by the Fast Fourier Transform, FFT, and the Inverse Fast Fourier Transform, IFFT, respectively) are powers of two. Since the lengths of the input and output transforms are both powers of two, overlaps of 50%, 75&, 25% (generally k*1/2 ") are possible. The decimation and interpolation ratios are limited to powers of two ($N_{FFT}/N_{IFFT}$). The successive blocks are, in the state of the art algorithm, multiplied in the frequency domain with identical filter responses, H(k).

Since the transform sizes are the powers of two, many parameters in the state-of-the-art modified fast convolution algorithm are fixed to the values achievable with this set of transform sizes. Thus, a problem here is that one would like to have more flexibility when it comes to the selection of the decimation ratio and overlap. For example, if the input FFT is 1024 points and the output IFFT is 32 points, the decimation ratio is 1024/32, i.e. 32. The overlap can be 50%, 75%, 25%, down to k*1/32,where "k" is an integer. If the IFFT size is instead chosen to be 64, the decimation ratio is 16 and the smallest granularity is considered to one bin, therefore the granularity of the overlap is 1/64 of the block length (possible overlaps k*1/64).

SUMMARY OF THE INVENTION

The present invention relates generally to the problem of filtering, decimation or interpolation and frequency conversion in the digital domain, to the use of a modified fast convolution algorithm in wideband multichannel receiver, channelization, and transmitter, de-channelization, structures of a radio communication system, and more particularly to the problems discussed above. The means of solving these problems according to the present invention are summarized in the following.

It can be seen above that the modified fast convolution algorithm as used in the e.g. channelization/de-channelization structures of SE9802059-7 is limited because the input and output transforms are both powers of two. This limits the number of possibilities in the decimation and interpolation ratios for channelization and de-channelization, respectively. Because these transform sizes are limited to powers of two, other parameters in the algorithm are then fixed to values achievable with this set of transform sizes.

Because transform sizes in the state of the art are powers of 2, it is not obvious to see that it is possible to use transform sizes in either end that also has other factors in them than two, like three or five. This works, without substantial modifications to the algorithm, as long as both the input and output transform have factors in common to provide for the overlap. For example, a common factor of four makes possible 50%, 75% and 25% overlap, or a common factor of three would make possible overlaps of 33% and 66%.

The expansion of the set to include transforms built with other factors than two increases the applicability of the modified fast convolution algorithm to beyond that of the state of the art and can be implemented with little modification to the algorithm except the change from power of two lengths of one of the transforms to lengths containing also other factors. This expansion of the set of usable transform lengths is of course welcomed. However, since the large size of the input and output transforms often has to be calculated in real time, this transform in practice is limited to a length that is a power of two. This, together with the requirement for having common factors in the input and output transform lengths, makes the range of possible choices of transform size very limited. One would like to have odd transform lengths on either end together with even length or power of two lengths on the other end. One could have 1/3 or 3/11 or other unusual overlaps with even length or power of two lengths on either end.

The basic problem when using input and output transforms without common divisors in the modified fast convolution algorithm is that no overlap fits both ends at the same time. For example, if the FFT size is 128 and the IFFT size is 27, the input end would fit overlaps k*1/2 " end the output and would like to have overlaps of the kind k*1/3 ". These are clearly incompatible.

The present invention makes it possible to use input and output transforms in the modified fast convolution algorithm whose sizes contain factors other than powers of two, e.g. three or five. This works, without substantial modifications to the algorithm, as long as both the input and output transform have factors in common to provide for the overlap. For example, a common factor of four makes possible 50%, 75% and 25% overlap, or a common factor of three would make possible overlaps of 33% and 66%. In the preferred embodiment, other modifications will be added to the invention which will extend the use of the modified fast convolution algorithm to input and output transforms which have no common factors.

FIG. 6 shows the situations in which the present invention are used. Across the top of the chart the MFC is divided into situations where the input and output transforms either have a common factor (CF) or do not have a common factor (No CF) in common with the overlap. On the left side of the chart are shown three situations for the sizes of the transforms. In the first one both the input and output transform sizes are a power of two. In the second one, one of the transforms is a power of two while the other is a power of two further multiplied by some other integer. In the third example both transform sizes can be any integer $n_1$ and $n_2$, where both of them may either have or not have a common factor with the other. The prior art examples of the modified fast convolution algorithm were limited to the case where the input and output transforms were both powers of two, having factors in common with each other. The present invention also works in the same cases as the prior art, but it also extends the MFC to cases where the transform sizes may be any size whatsoever, with or without factors in common.

Accordingly it is an object of the present invention to provide a method to increase the flexibility when it comes to the decimation ratio and overlap in the modified fast convolution algorithm.

The invention can be described as consisting of essentially 3 steps. The first step is to make sure that we use different overlaps on consecutive blocks that, on average, give the same overlap on both in the input and output ends. The second step is to align the signal in consecutive blocks of time. The third step is then to compensate for phase shifts due to frequency shifting.

The essence of the invention is that it decouples the input and output transform lengths in the modified fast convolution algorithm from each other and from the overlap. It makes it possible to use any transform length on the input together with any transform length on the output and at the same time use any overlap. This provides am enormous amount of freedom compared with the limitations of state of the art. Input and output sample rates can now be chosen with much finer resolution, and decimation and interpolation ratios need no longer be powers of two.

Although the invention has been summarized above, the method according to the present invention is defined according to the independent claim. Various embodiments are further defined in the dependent claims.

The present invention is not discussed in terms of any particular system. It is particularly applicable to many radio base station applications in e.g., cellular, Land Mobile Network (LMR), satellite, wireless local area networks (WLAN's). However, it is not limited to these systems and may, in general, be used in any system using the modified fast convolution algorithm. In addition, it's use is not restricted to use in basestations, but may also be used in e.g. future mobile terminals that are also capable of handling multiple channels simultaneously.

BRIEF DESCRIPTION OF THE DRAWINGS

The present invention will now be described in more detail with reference to preferred embodiments of the present invention, given only by way of example, and illustrated in the accompanying drawings, in which:

FIG. 8 shows the phase of the frequency response and the corresponding delay of the impulse response.

FIG. 9 illustrates the accumulated difference in non-overlapping parts of the input and output blocks.

DETAILED DESCRIPTION

The method according to the present invention separates into three varieties: (1) letting the input transform determine the overlap, (2) letting the output transform determine the overlap, or (3) choosing an overlap that is independent of both the input and output block lengths. These solutions contain the same ingredients, as the inventive aspect is the same, but will look slightly different in their specific implementations. Examples from the first two varieties will be included in the following description of the solution steps.

Figure 1:
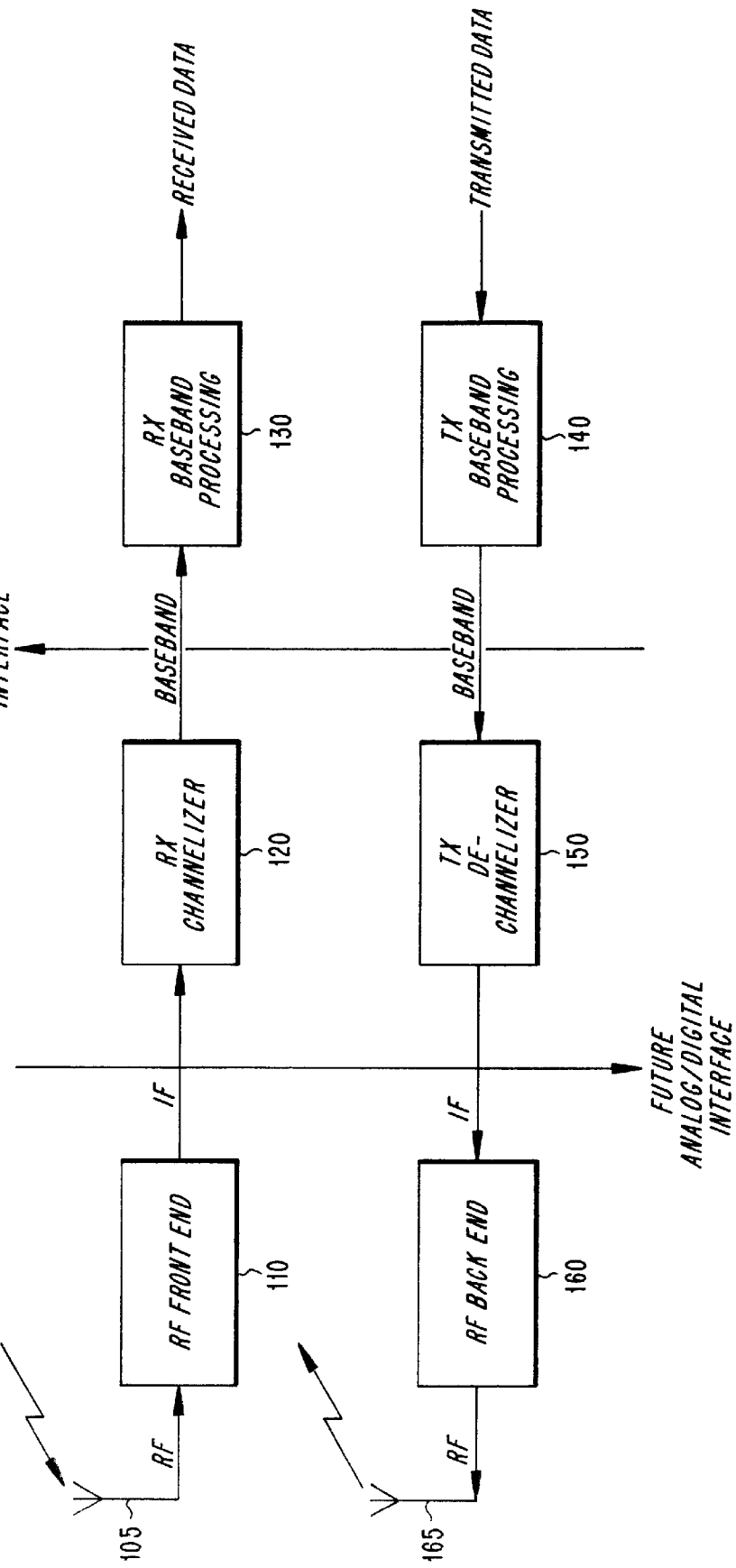
FIG. 1 is a diagram of a traditional radio transmitter and receiver architecture.
Figure 2:
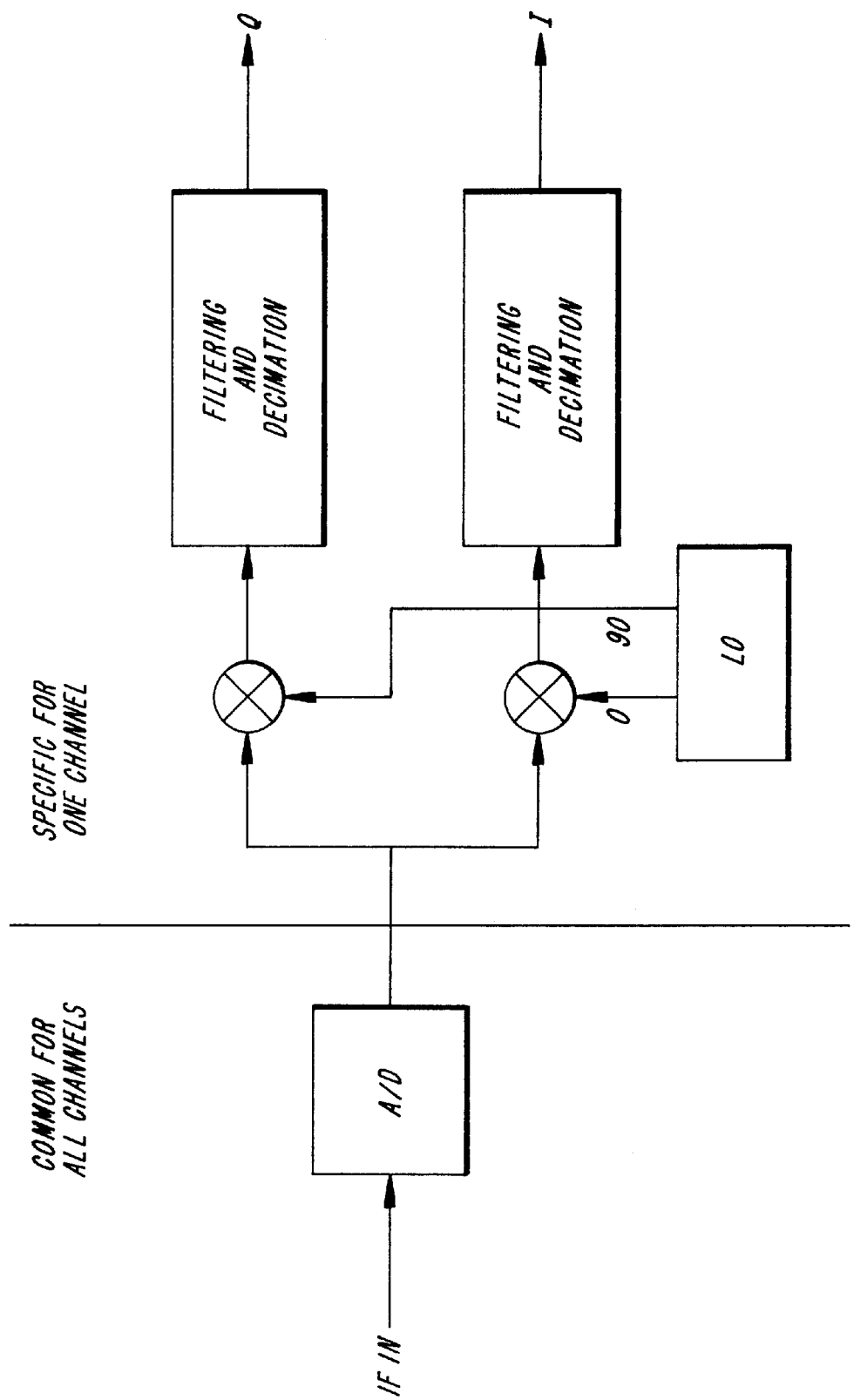
FIG. 2 is a diagram of a state of the art IQ-demodulating digital receiver.
Figure 3:
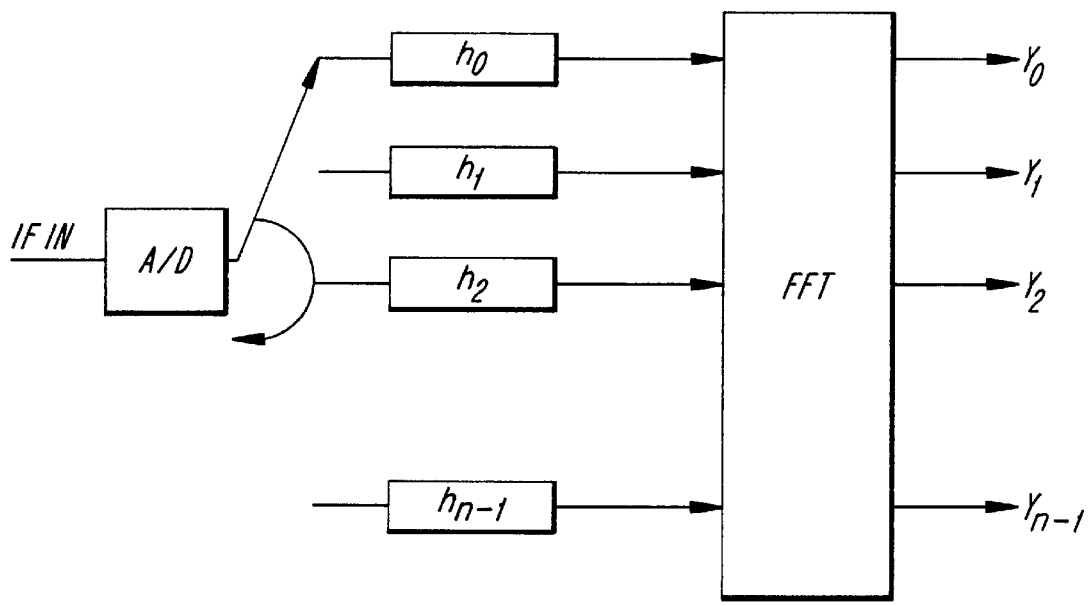
FIG. 3 is a diagram of a state of the art decimated filter bank.
Figure 4:
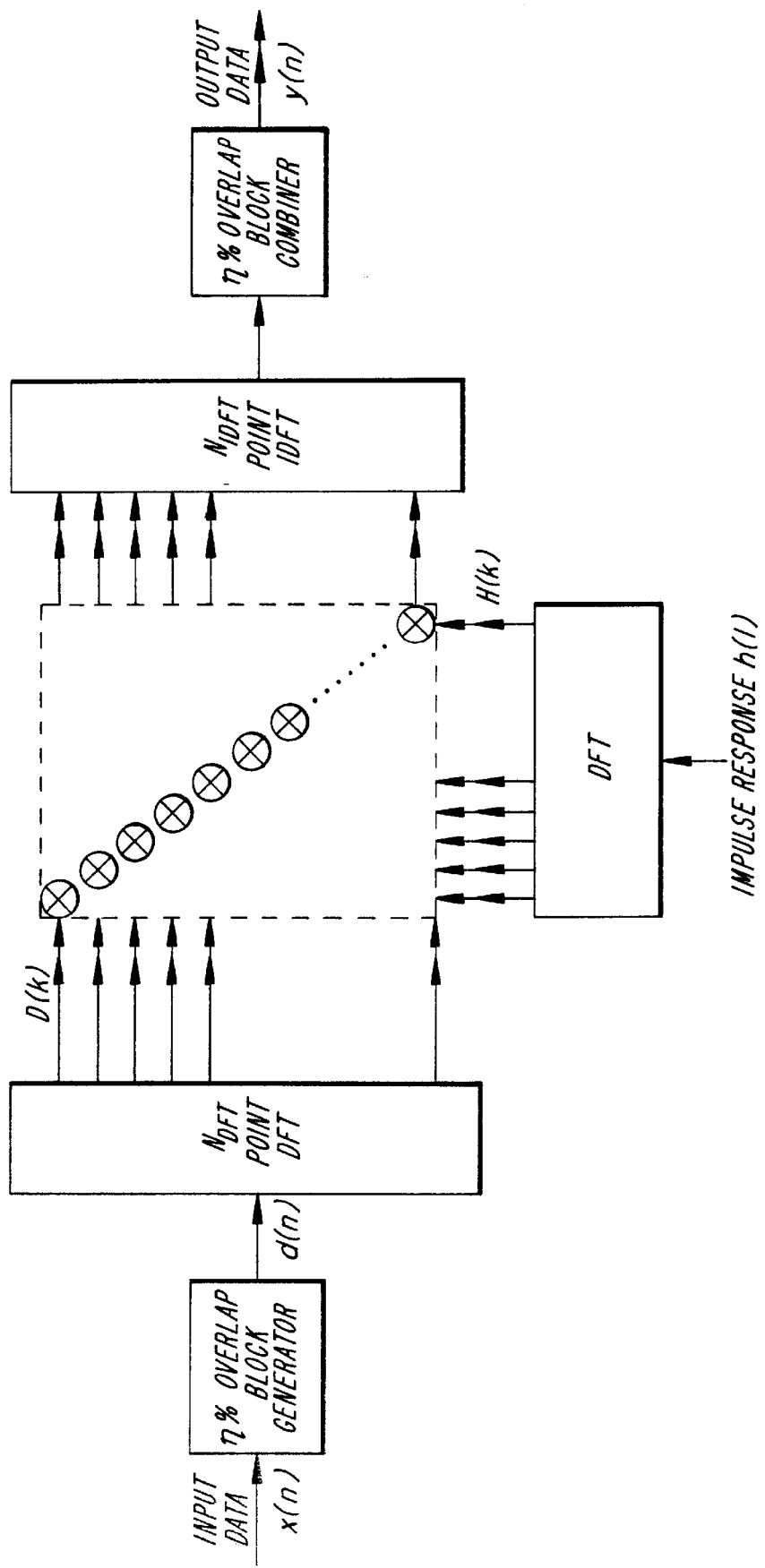
FIG. 4 is a diagram of a state of the art fast convolution algorithm.
Figure 5:
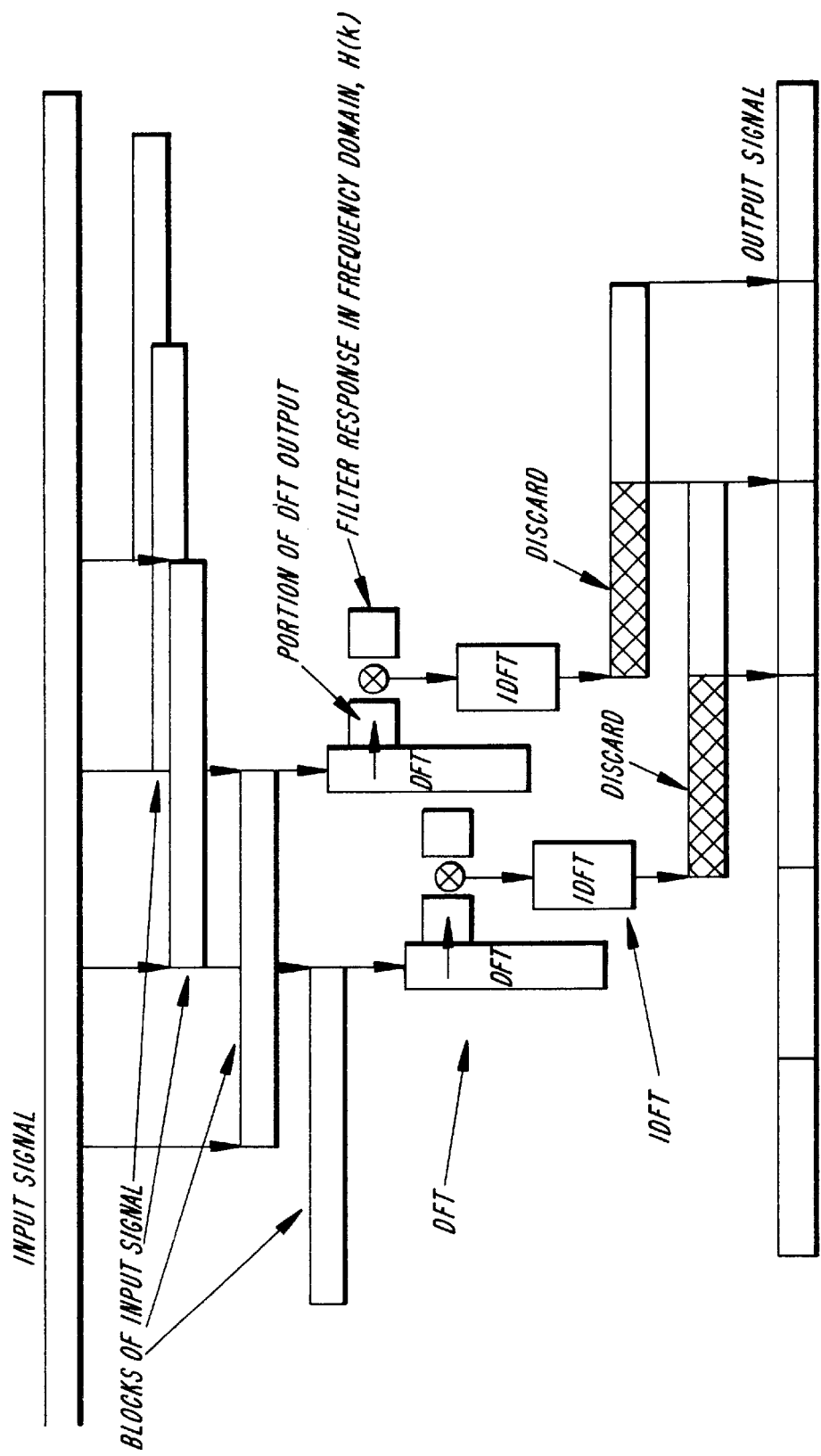
FIG. 5 is a diagram of a modified fast convolution algorithm of the overlap-save type.
Figures 6, 7:
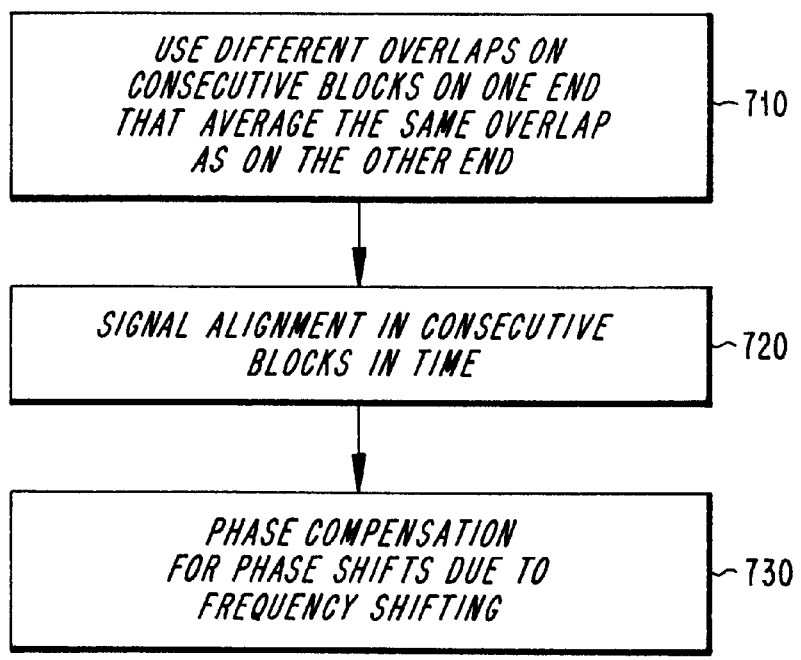
FIG. 6 illustrates the various combinations of input and output transform sizes covered by the prior art and the present invention.
FIG. 7 is an overview of the three basic steps of the present invention.

There are essentially 3 steps in the method of the present invention as shown in FIG. 7. The first step 710 is making sure that we use different overlaps on consecutive blocks that, on average, give the same overlap as on the opposite end of the algorithm. The second step 720 is to align the signal in consecutive blocks of time. The third step 730 is then to compensate for phase shifts due to frequency shifting. These steps will be described in further detail below.

The first step 710 is making sure that we use different overlaps on consecutive blocks that, on average, give the same overlap as on the opposite end of the algorithm. This is due to the fact that in order to be able to use transform lengths without common divisors (i.e. GCD $[n_1, n_2]=1$, "GCD" is "Greatest Common Divisor") we must make sure that the input and output rates are compatible with the bandwidth of the input and output transforms, respectively.

If the overlap is denoted l/m, then in general m different overlaps will have to be used on one or both ends of the algorithm. If l and m have a common factor, they can both first be reduced by this factor. We can then create vectors of length m, representing the lengths of either the overlapping or the non-overlapping parts of the blocks, that on average give the overlap l/m. The sequence of overlaps (or non-overlaps) will repeat cyclically, although it is also possible to implement the invention so that the overlaps come randomly, as long as the average on both sides of the algorithm is the same. If m is a factor in the length of one of the transforms, that end can have the same overlap for all blocks.

The first step 710 can be illustrated with an example where we assume that the input transform has even length, the output transform has odd length and the overlap is 50% on the input. The overlap on the output could then be separated into two overlaps, one of odd length and one of even length, that are used interleavingly on every other block.

As a second example, we assume that the input transform is 128 points and the output transform is 25 points. An overlap of 2/5 can then be achieved through e.g. having the non-overlapping parts of the input 77, 77, 76, 77 and 77 samples long, respectively. The average of these numbers is 76.8, which divided by 128 gives 3/5 (overlap=2/5 ). The overlap on the output would be 2/5 of 25, i.e. 10, for all blocks.

In the second step 720 of the invention we align the signal in the consecutive blocks in time. When using different overlaps the blocks' starting points do not come regularly, as would occur when the overlaps are the same. For example, when using a 27-point IDFT together with an even DFT and 50% overlap, the time between the first sample of the blocks on the output end could be 13 and 14 samples, respectively. This yields an average of 13.5.

The time alignment is done by time-shifting the signal within the block so that it compensates for the slight misalignment of the starting time of the respective blocks.

This can be done by multiplying the DFT samples coming from different blocks by sinusoids with different incremental phase shifts (the DFTs of the different delays). An equivalent, simpler and less computationally complex approach would be to multiply the coefficients of the filter response in the frequency domain, H(k), with the same incremental phase shift. This means that a set of m filter responses, corresponding to the m different time shifts, is needed.

A time shift of the impulse response of x samples in a block of length n is obtained by multiplying with a complex exponential, a sinusoid, over the frequency response samples H(k), so that $$H_{delay}(k) = H(k) * \Theta^{-j2\pi x k/n}$$

We see that x/n is a measurement of the delay as "part of the block length". The correspondence between the incremental phase shift (−2pix/n in the equation) of the frequency response and the delay of the impulse response is shown in FIG. 8. Observe that a negative time shift of n/5 (corresponding to x/n=−1/5) looks like a positive time shift of 4n/5, since all shifts are cyclic within the block.

The time alignment is calculated via the difference between the relative starting points for the blocks on the input and output ends of the algorithm, which is the same as the accumulated difference between the input and output non-overlapping parts. FIG. 9 illustrates this concept.

Figure 10:
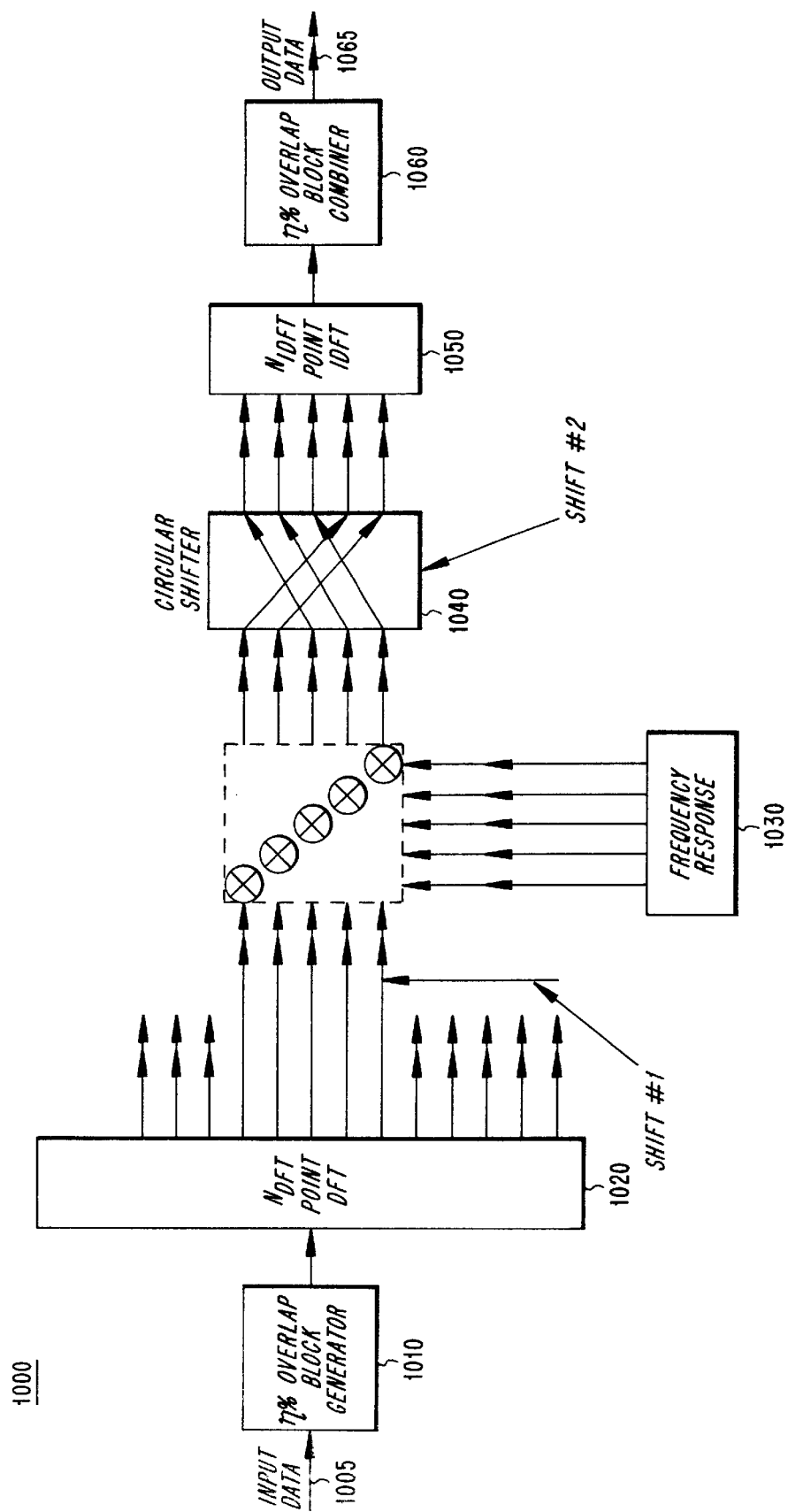
FIG. 10 illustrates the frequency shifts of the modified fast convolution algorithm.

The incremental phase shift to the bins of block p (p>1) becomes $$Tc(p) = Tc(1) - 2\pi \sum_{q=1}^{p-1} \left( \frac{n_1 - n_{olp1}(q)}{n_1} + \frac{n_2 - n_{olp2}(q)}{n_2} \right)$$

where $n_1$ and $n_2$ are the lengths of the input and output transforms and $n_{olp1}(q)$ and $n_{olp2}(q)$, see 1190, 1195, respectively, FIG. 10, are the lengths of the overlapping parts of the q-th input and the output blocks, respectively. The time compensation factor for block one, Tc(1) can often be set to zero, but a certain time shift can also be added equally to all blocks (by setting Tc(1) to a value other than zero) in order to minimize the maximum absolute time shift.

The time alignment is implemented by multiplying the original frequency response, H(k), with a sinusoid, $\Theta^{jTc(p)*k}$, so that for the filter response number p $$H_p(k) = H(k) \, \Theta^{jTc(p)*k}$$

An effort should be made to have a small accumulated difference in (non-)overlap, the sum in the equation for Tc(p), through the design of the input and output overlap vectors, while at the time making the overlap as close as possible to 1/m. This increases the maximum length of the impulse response of the filter that can be implemented.

In the example discussed above with a 27-point IDFT and 50% overlap we had alternating times between the first sample of each block of 13 and 14 bins, yielding an average of 13.5. We have to account for this extra half-sample timeshift, and we would need a positive timeshift of half a sample (counted on the output) on the blocks that come 13 samples after the previous block. This would make the apparent starting points of the signal in the blocks separated 13.5 samples (27/2), which is what we want. In practice this is achieved by having two frequency responses with a difference in delay of half a sample. An incremental phase shift of 2pi/27*1/4 and 2pi/27*−1/4 per bin, respectively, for the two frequency responses is thus required.

For the example with a 128 point input and 25 point output transform, one must compensate for the five different starting points of the input blocks relative to the output blocks. These differences are 0, +1/5, +2/5, −1/5, −2/5, sampled on the input end. This calls for having five filters with different time shifts. These would be implemented as five different incremental phase shifts in the frequency domain with the values 2pi/128*0, 2pi/128*1/5, 2pi/128*2/5, 2pi/128*−1/5, 2pi/128*−2/5 per bin, respectively.

Finally, the third step 730 of the method of the present invention is to compensate for phase shifts due to frequency shifting. FIG. 10 illustrates two shifts, Shift #1 and Shift #2, possible in the modified fast convolution algorithm as implemented in a channelier/de-channelizer. In the modified fast convolution algorithm, when used for channelization/dechannelization, a frequency shift, Shift #1, is included which is performed by using a certain range of the frequency domain samples coming from the DFT 1020 in a channelizer 1000 or by inserting the filtered DFT samples at a certain place in the large IDFT of a dechannelizer. In the channelizer 1000 this can be viewed as if the lowest selected bin of the DFT 1020 is shifted down to zero frequency, and in the dechannelizer as if the zero bin of the DFT is shifted up to the lowest frequency of the channel.

There is also the possibility of circularly shifting 1040 the bins within the selected range after the multiplication with the frequency response 1030. This is done in order to shift the center frequency of the signal within the decimated frequency range. This technique, described further in the U.S. patent application Ser. No. 9/128,062 "NCO Size Reduction" to Hellberg, the entirety of which is hereby incorporated by reference, depends on the possibility to perform this shift. Observe that Shift #1 in the case of a channelizer 1000 is a negative frequency shift since the first bin of the range of bins going into the multiplication with the frequency response is shifted down to zero frequency.

A shift of the bins in the frequency domain corresponds to a multiplication of the time samples in a block of size n by a sinusoid, $\Theta^{j2pi*f/n*t}$, where f is the frequency shift (an integer) and t is the number of a sample in the block of size n. Over one whole transform block, all sinusoids corresponding to different shifts in the frequency domain return to their initial phase. However, if the blocks are overlapping, they are patched together with the next block at an earlier point at which the sinusoid in general will not have returned to the initial phase. This means that we will have a phase discontinuity between the blocks. A compensation therefore has to be performed in order to align consecutive blocks in phase two correct for phase errors due to the frequency shifting in the frequency domain.

The phase compensation is done by calculating to which phase the modulating sinusoid has moved during the non-overlapping part of the block and shift the phase of the next block accordingly, by multiplying the whole block with a constant phasor. After a certain number of blocks, in general the same as the number of different timeshifts, m, the phase has returned to its initial value.

The phase compensation can also be incorporated into the set of filter responses by multiplying the elements of each filter response with a constant phasor, since the number of different phase shifts that are needed generally is the same as the number of different time shifts. In addition to being dependent on the length of the accumulated non-overlapping parts of the previous blocks the phase compensation also depends on the frequency shift, which means that an individual set of filter responses is generally required for each channel in the channelizer.

The phase compensation for the p-th (p>1) block is $$Pc(p) = Pc(1) + 2\pi \left( \sum_{q=1}^{p-1} n - n_{olp}(q) \right) \frac{f_{shift}}{n}$$

where n is the length of the transform, $n_{olp}(q)$ is the length of the overlapping part of the q-th block and $f_{shift}$ is the frequency shift. The phase compensation for the first block, Pc(1), can be set to zero. The values of accumulated non-overlapping parts times the frequency shift that are above n can be reduced modulo n, since this number represents one full circle of the phasor. The values of accumulated non-overlapping parts themselves can of course also be reduced to modulo n.

The phase compensation is performed by multiplying all elements in the time-aligned filter response of block p, Hp(k), with the constant phasor $e^{jPc(p)}$, so that the phase compensated frequency response Hc,p(k) becomes:

$$H_{c,p}(k) = H_p(k) * \Theta^{jPc(p)}$$

The formula for the phase compensation is the same for both Shift #1 and Shift #2, but the lengths of the transforms are in general different and the accumulated non-overlapping parts are in general also different and have to be calculated separately.

If both frequency shifts are included, two phase compensations must be calculated. They can be summed and incorporated into the same phase compensation. The formula for phase compensation then becomes:

$$Pc(p) = Pc(1) + 2\pi \left( \left( \sum_{q=1}^{p-1} n_1 - n_{olp1}(q) \right) \frac{f_{shift1}}{n_1} + \left( \sum_{q=1}^{p-1} n_2 - n_{olp2}(q) \right) \frac{f_{shift2}}{n_2} \right)$$

where the phase compensation for the first block also here is assumed to be zero. In a dechannelizer, the shift associated with inserting the filtered DFT samples at a certain place in the large IDFT is a positive shift, which must be remembered when using the formula for phase compensation.

For the example with the non-overlapping parts of the input 77, 77, 76, 77 and 77 samples long, the accumulated value from the previous blocks is 77, 154, 230 and 307 for blocks 2 through 5. Assuming only Shift #1, the phase compensation would then become 0, 2pi*77/128*$f_{Shift1}$, 2pi*154/128*$f_{Shift1}$, 2pi*230/128*$f_{Shift1}$ and 2pi*307/128*$f_{Shift1}$. Since 307+77, 384, is divisible by 128 the phase will return to zero after five blocks, and the sequence of phase compensations can be repeated.

In the example system with 50% overlap previously described the phase compensation due to the first shift is the same as for systems having transforms with common factors and uniform overlaps. This would also be the case for other systems where the overlap is determined by the DFT size in the case of a receiver (channelizer) or determined by the IDFT size in the case of a transmitter (dechannelizer). This phase compensation is quite simple to implement since it is calculated modulo 2 in the case of 50% overlap and modulo 4 in the case of 75% and 25% overlaps. It is also computationally cheap since the multiplication of the blocks by the two or four uniformly spaced phasors are just multiplications by plus and minus one or multiplications by plus and minus one and swapping the real and imaginary parts of the signal. This phase compensation has previously been thoroughly described in U.S. patent application Ser. No. 09/156,630, titled "Flexibility Enhancement to the Modified Fast Convolution Algorithm" filed on Sep. 18, 1998 to Leyonhjelm et al., the entirety of which is hereby incorporated by reference.

On the other end, the phase compensation due to a cyclic shift within the smaller range (Shift #2 in FIG. 10) would be dependent on the different overlaps on this end. For the example system having a 27-point IDFT this compensation would be 0 and 2pi*13/27*$f_{Shift2}$ on consecutive blocks.

Above, it was mentioned that the present invention can be divided into three varieties: (1) letting the input transform determine the overlap, (2) letting the output transform determine the overlap, or (3) choosing an overlap that is independent of both the input and output block lengths. We will now discuss an example of the third type: a fully implemented system where the overlap is independent of both the input and output transform lengths. As an example of a modified fast convolution system having transforms with no common factors and overlap independent on either transform size we use $n_1=256(=2^8)$, $n_2=23$ (prime) and the overlap 1/m=3/7.

Neither the input or output transform length can be divided by 7, so both input and output (non-)overlap vectors of length 7 have to be created. Since $n_1*(m-1)/m$ equals $146^2/7$ we let the input vector of non-overlapping parts be [146 147 146 146 146 147 146] which, as one of many possibilities, averages $146^2/7$. In the same way $n_2*(m-1)/m$ equals $13^1/7$ so the output non-overlap [13 13 13 14 13 13 13] is chosen.

The vector of incremental phase shifts, Tc(p), corresponding to the time alignments of blocks 1 through 7 becomes (all numerators modulo 256 and 23, respectively)

$$Tc([1\ 2\ 3\ 4\ 5\ 6\ 7]) = -2\pi \left[ 0, \frac{146}{256} - \frac{13}{23}, \frac{37}{256} - \frac{3}{23}, \right.$$

$$\frac{183}{256} - \frac{16}{23}, \frac{73}{256} - \frac{7}{23},$$

$$\left. \frac{219}{256} - \frac{20}{23}, \frac{110}{256} - \frac{10}{23} \right]$$

and the phase compensation, Pc(p), for blocks 1–7 is accordingly $$Pc([1\ 2\ 3\ 4\ 5\ 6\ 7]) = -\frac{2\pi}{256}[0, 146, 37, 183,$$

$$73, 219, 110]f_{shift1} +$$

$$\frac{2\pi}{23}[0, 13, 3, 16, 7, 20, 10]f_{shift2}$$

where the frequency shifts have been left variable. Remembering that $f_{shift1}$ is a negative frequency shift in a channelizer, if the range to be filtered starts at e.g. 97 the value of $f_{shift1}$ would be −97.

Figure 11:
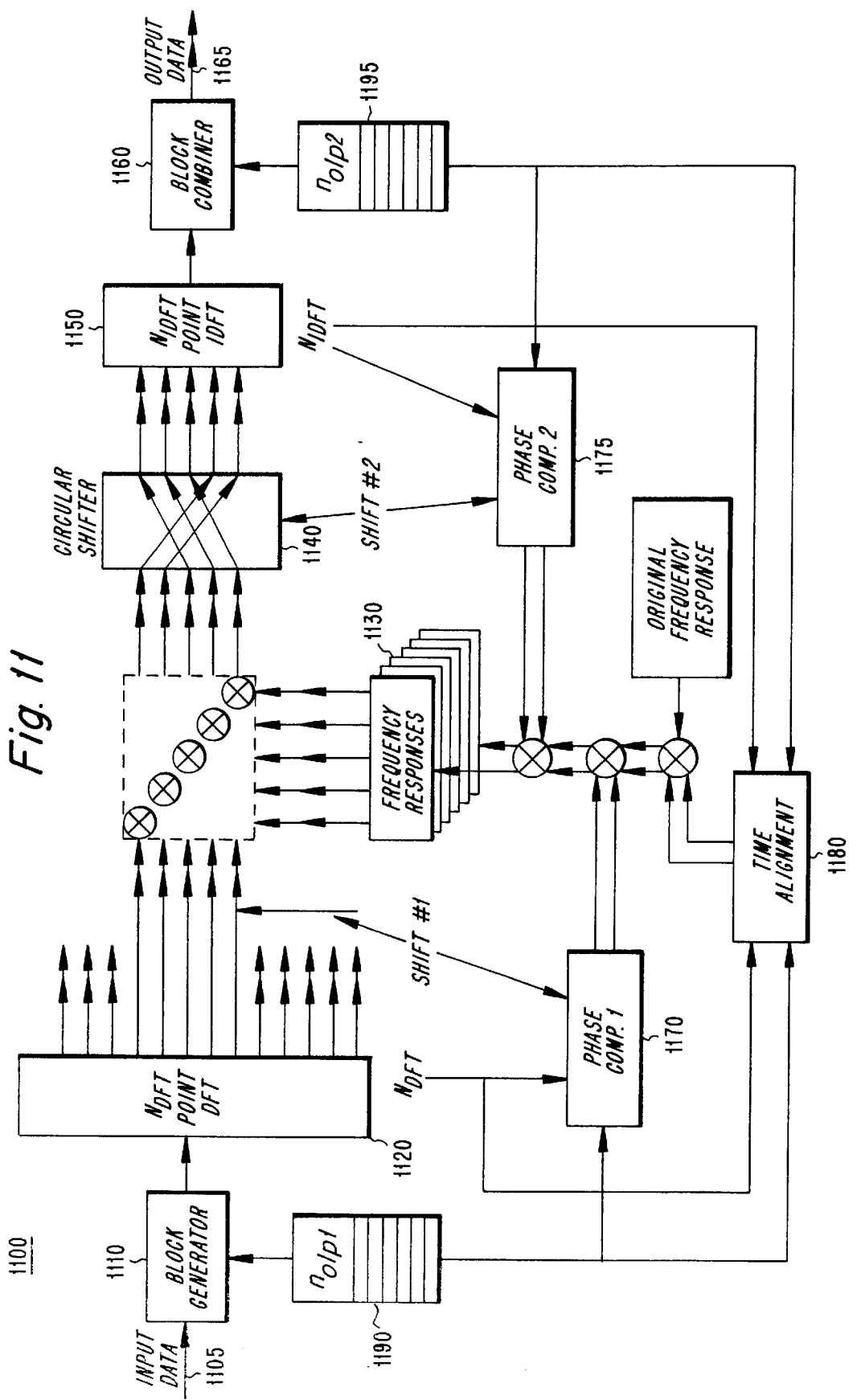
FIG. 11 illustrates a fully implemented system according to the present invention.

The fully implemented system is shown conceptually in FIG. 11. The figure illustrates that there are several frequency responses 1130 that each has a time alignment dependent on the input and output overlap and transform lengths. The phase compensations 1170, 1175, depend on the overlap, transform length and shift on each end and are also performed on each of the frequency responses 1130.

The preferred implementation as described above uses m different frequency responses 1130 into which all time alignments 1180 and phase compensations 1170, 1175, are absorbed. This means that these frequency responses 1130 can be computed once and then used for a certain channel as long as desired, which implies a low computational cost at the expense of increased memory needed for storing these different responses 1130.

In alternate embodiments the time alignments 1180 and phase compensations 1170, 1175, can be multiplied to the blocks in real time, minimizing storage. In yet another embodiment it is possible to multiply the blocks only with the phase compensations 1170, 1175, which differs between channels, in real time and to use a set of filter responses 1130 with pre-multiplied time alignments 1180, which do not differ between channels.

Although the examples in this document have been concentrated towards channelizers 1100, the operations described work equally well for de-channelizers, with slight modifications as indicated. They also work for both overlap-add and overlap-save implementations, for arbitrary lengths of the input and output transforms and for arbitrary overlaps l/m. Although it may appear from the description above that the solution is only for the case GCD[$n_1$, $n_2$]=1, in fact all other cases when there are not enough common factors, or when the overlap denominator, m, does not have a factor in common with $n_1$ or $n_2$, are also covered. Even when there are factors in common between the input and output transform lengths or between the transform lengths and the overlap denominator the operations work. These are only special cases which may lead to fewer different overlaps on either end or fewer alignments and compensations.

The embodiments described above serve merely as illustration and not as limitation. It will be apparent to one of ordinary skill in the art that departures may be made from the embodiments described above without departing from the spirit and scope of the invention. The invention should not be regarded as being limited to the examples described, but should be regarded instead as being equal in scope to the following claims.

What is claimed is:

1. A method for increasing the number of usable transform lengths and overlaps in a signal transformed in a modified fast convolution algorithm, said modified fast convolution algorithm having input length $n_1$, output length $n_2$, and overlap l/m, the method comprising:

providing overlaps on consecutive blocks on one side that, on average, give the same overlap as on the other side, wherein the consecutive blocks are not of the same length; and aligning the signal in consecutive blocks in time.

2. The method of claim 1, further comprising:

compensating for phase shifts due to frequency shifting in said consecutive blocks.

3. The method of claim 1, wherein:

both $n_1$ and $n_2$ are equal to a power of $2(2^x)$ and there is a common factor in $n_1$ and $n_2$ in common with the overlap l/m.

4. The method of claim 1, wherein:

both $n_1$ and $n_2$ are equal to a power of $2(2^x)$ and there is not a common factor in $n_1$ and $n_2$ in common with the overlap l/m.

5. The method of claim 1, wherein:

there is a common factor in both $n_1$ and $n_2$ in common with the overlap l/m and both $n_1$ and $n_2$ are not equal to a power of $2(2^x)$.

6. The method of claim 1, wherein said providing step further comprises:

creating a vector of length m, representing the lengths of either the overlapping or the non-overlapping parts of the blocks, the average of the elements of said vector being l/m and the sequence of overlaps in said vector repeating cyclically.

7. The method of claim 1, wherein said time aligning step further comprises:

multiplying DFT samples coming from different blocks by sinusoids with different incremental phase shifts corresponding to the DFTs of the different delays.

8. The method of claim 1, wherein said time aligning step further comprises:

multiplying the coefficients of the filter response in the frequency domain, H(k), with the same incremental phase shift.

* * * * *